(12) United States Patent
McEwen et al.

(10) Patent No.: US 7,089,483 B2
(45) Date of Patent: Aug. 8, 2006

(54) TWO STAGE DETECTOR HAVING VITERBI DETECTOR MATCHED TO A CHANNEL AND POST PROCESSOR MATCHED TO A CHANNEL CODE

(75) Inventors: Peter McEwen, Santa Clara, CA (US); Kelly Fitzpatrick, Westboro, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 10/793,414

(22) Filed: Mar. 4, 2004

(65) Prior Publication Data

US 2004/0181732 A1 Sep. 16, 2004

Related U.S. Application Data

(62) Division of application No. 09/352,160, filed on Jul. 12, 1999, now Pat. No. 6,732,328.

(51) Int. Cl.
*H03M 13/03* (2006.01)
(52) U.S. Cl. ............... 714/795; 714/792; 375/341; 375/265
(58) Field of Classification Search ........... 714/795, 714/792; 375/341, 265
See application file for complete search history.

(56) References Cited

U.S. PATENT DOCUMENTS

| | | | | |
|---|---|---|---|---|
| 5,257,272 A * | 10/1993 | Fredrickson | ............... | 714/792 |
| 5,260,703 A * | 11/1993 | Nguyen et al. | ............ | 341/100 |
| 5,452,015 A * | 9/1995 | Hulyalkar | .................. | 348/608 |
| 5,485,472 A * | 1/1996 | Fredrickson | ............... | 714/792 |
| 5,508,752 A * | 4/1996 | Kim et al. | ................... | 348/608 |
| 5,521,945 A * | 5/1996 | Knudson | .................... | 375/341 |
| 5,689,532 A * | 11/1997 | Fitzpatrick | ................. | 375/341 |
| 5,881,071 A * | 3/1999 | Kuznetsov et al. | ......... | 714/752 |
| 5,889,823 A * | 3/1999 | Agazzi et al. | .............. | 375/341 |
| 5,949,357 A * | 9/1999 | Fitzpatrick et al. | .......... | 341/68 |
| 5,949,831 A * | 9/1999 | Coker et al. | ................ | 375/341 |
| 6,052,248 A * | 4/2000 | Reed et al. | ................... | 360/53 |
| RE36,980 E * | 12/2000 | Kim et al. | ................... | 348/608 |
| 6,158,027 A * | 12/2000 | Bush et al. | ................. | 714/709 |
| 6,185,173 B1 * | 2/2001 | Livingston et al. | ...... | 369/59.21 |
| 6,185,265 B1 * | 2/2001 | Campanella | ............... | 375/341 |
| 6,201,798 B1 * | 3/2001 | Campanella et al. | ...... | 370/326 |
| 6,233,289 B1 * | 5/2001 | Fredrickson | ............... | 375/341 |

(Continued)

OTHER PUBLICATIONS

Karabed, Siegel, "Matched Spectral-Null Codes for Partial-Response Channels", *IEEE Transactions On Information Theory*, vol. 37, No. 3, May 1991, pp. 818-855.

(Continued)

*Primary Examiner*—Joseph Torres

(57) ABSTRACT

A two-stage sampling data detector for a partial response channel having a channel code encoder for encoding user information sequences into blocks of code words in accordance with a predetermined channel block code characterized by a list of most likely error-events comprising impermissible code words. The detector includes a first-stage detector, such as a Viterbi detector, connected to receive samples from the partial response channel and matched to characteristics of the channel and not to the channel code, puts out unchecked bit estimates. A second stage postprocessor checks the bit estimates in relation to derived detector decision metrics information and the channel block code, and puts out post-processed bit estimates to a channel code decoder after correcting detected erroneous sequences in accordance with the decision metrics information, information derived from the channel code, and the list of most likely error-events. A method for generating the channel block code is also described.

9 Claims, 10 Drawing Sheets

U.S. PATENT DOCUMENTS

| | | | |
|---|---|---|---|
| 6,278,748 B1* | 8/2001 | Fu et al. | 375/341 |
| 6,353,911 B1* | 3/2002 | Brink | 714/780 |
| 6,732,328 B1 | 5/2004 | McEwen et al. | 714/795 |

OTHER PUBLICATIONS

Moision, "Error Event Characterization and Coding for the Equalized Lorentzian Channel", *CMRR Research Review*, Feb. 12, 1998.

McEwen, Wolf, "Trellis Codes for (1,k) E²PR4ML with Squared Distance 18", *IEEE Transactions On Magnetics*, vol. 32, No. 5, Sep. 1996, pp. 3995-3997.

Seshadri, Sundberg "List Viterbi Decoding Algorithms with Applications," *IEEE Transactions on Communications*, vol. 42, Nos. 2/3/4, pp. 313-323, Feb./Mar./Apr. 1994, pp. 313-332.

Umemoto, M.; "On coding and decoding for high-order partial response systems;" *IEEE Transactions on Magnetics*; vol. 34; Issue 1; Part: 1; Jan. 1998; pp. 80-84.

Kuznetsov, A.V.; Umemoto, M.; "Structured set partitions and multilevel concatenated coding for partial response channels;" *IEEE Transactions on Communications*; vol. 47; Issue: 6; Jun. 1999; pp. 856-861.

Umemoto, M.; "Interleaved maximum likelihood decoding in high-order partial responses for high-speed magnetic recording systems;" Communications: The Key to Global Prosperity Global Telecommunications Conference, 1996; *GLOBECOM '96*; vol. 1; 1996.

Soljanin, E.; Agazzi, O.E.; "An interleaved coding scheme for (1–D)(1+D)/sup 2/ partial response with concatenated decoding;" Communications: The Key to Global Prosperity Global Telecommunications Conference, 1996; *GLOBECOM '96*; vol. 1, 1996, p. 353.

Despotovic, M.; Senk, V.; "Channel trellis codes for precoded partial-response 1-D channel;" *Electronics Letters*; vol. 31; Issue 19; Sep. 14, 1995; pp. 1627-1628.

Cherubini, G.; Olcer, S.; "Concatenated coding for binary partial-response channels;" IEEE International Conference on Communications, 1994. ICC '94, SUPERCOMM/ICC '94, Conference Record, 'Serving Humanity Through Communications.', 1994, pp. 1789-1794.

* cited by examiner

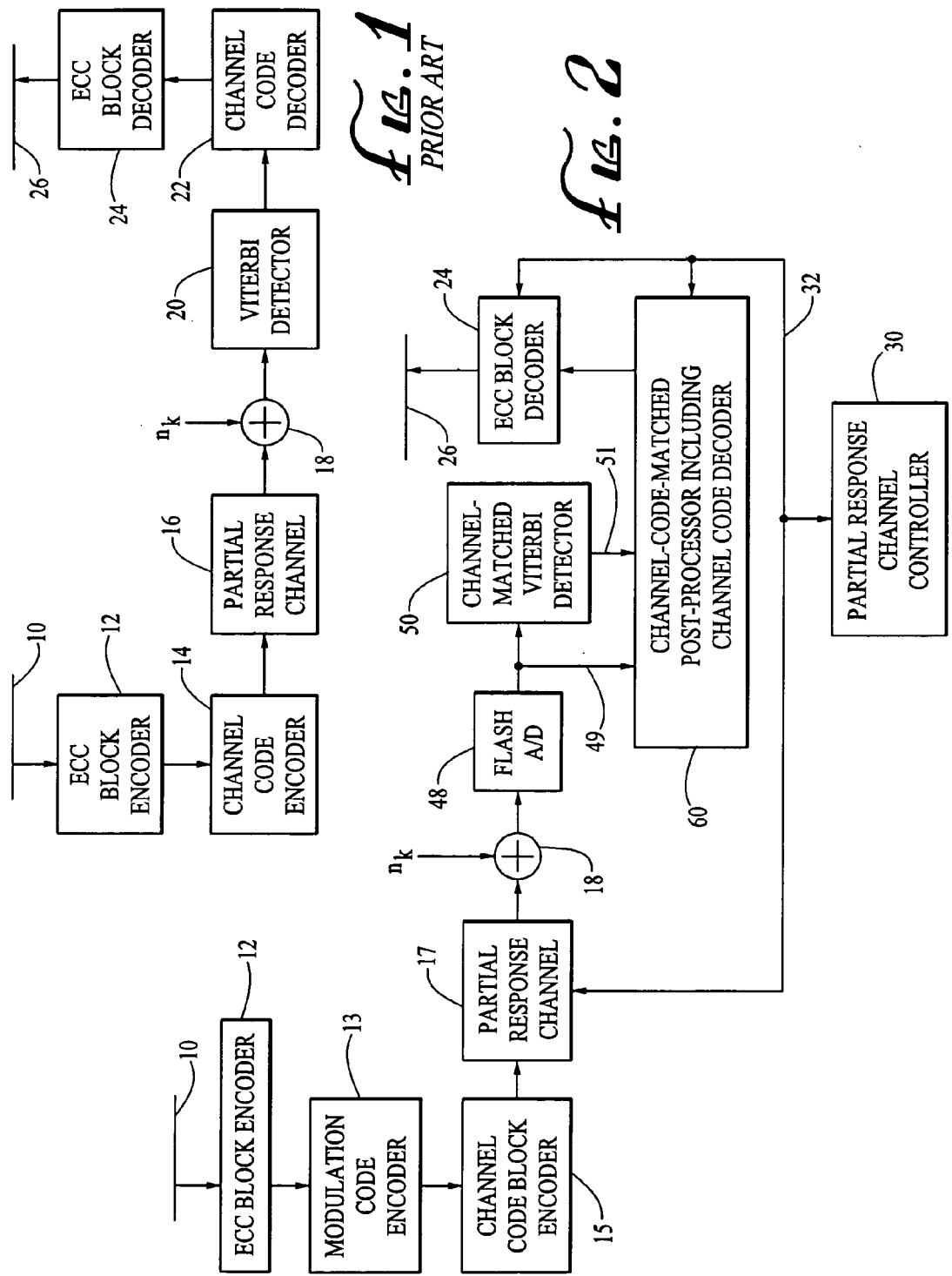

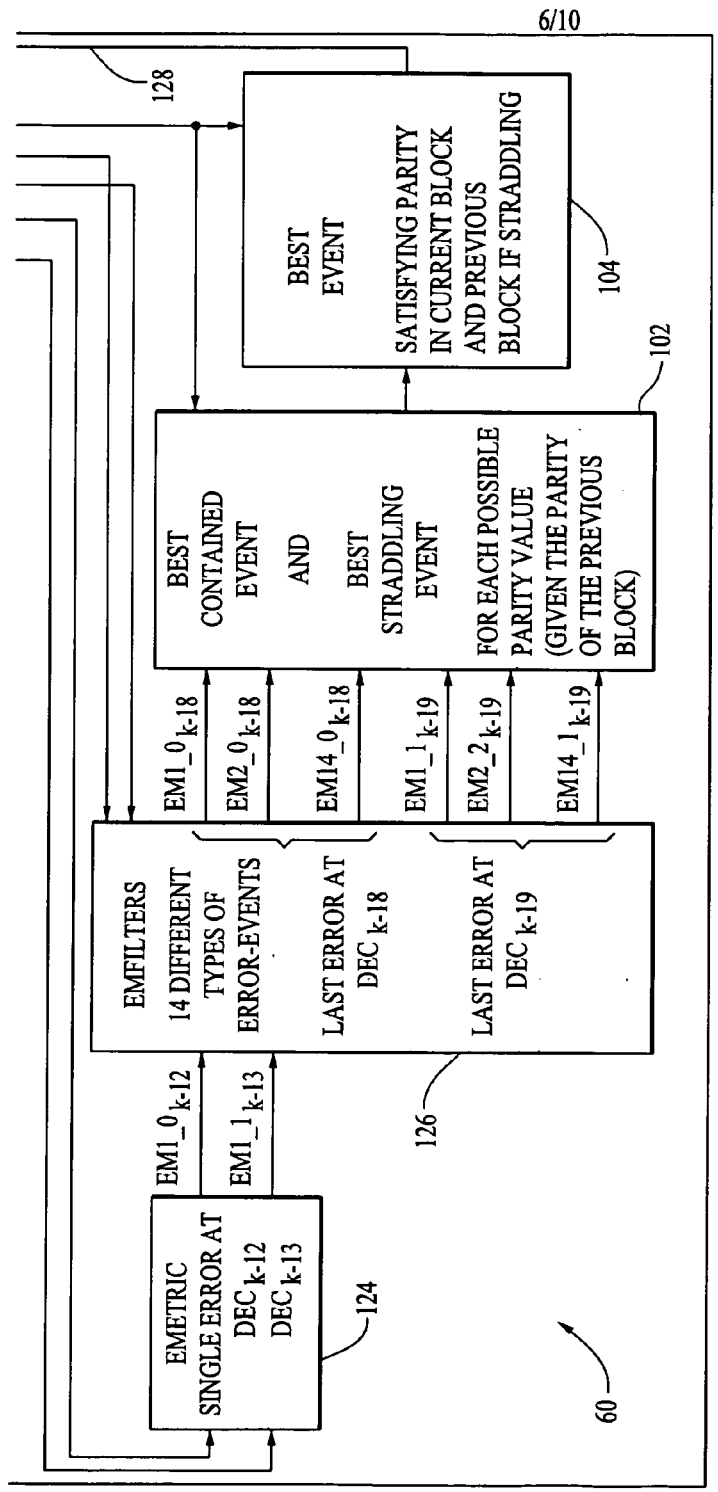
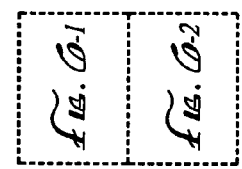

$$DM_k(EVENT) = M(VDATA + EVENT) - M(VDATA)$$

$$= \sum_{j=1}^{k}(y_j - ((VDATA+EVENT)\otimes H)_j)^2 - \sum_{j=1}^{k}(y_j - (VDATA\otimes H)_j)^2$$

$$= \sum_{j=1}^{k}(VERROR_j - (EVENT\otimes H)_j)^2 - \sum_{j=1}^{k}VERROR_j^2$$

$$= \sum_{j=1}^{k}(EVENT\otimes H)_j^2 - 2VERROR_j(EVENT\otimes H)_j = d(EVENT)^2 - \sum_{j=1}^{k}2VERROR_j(EVENT\otimes H)_j$$

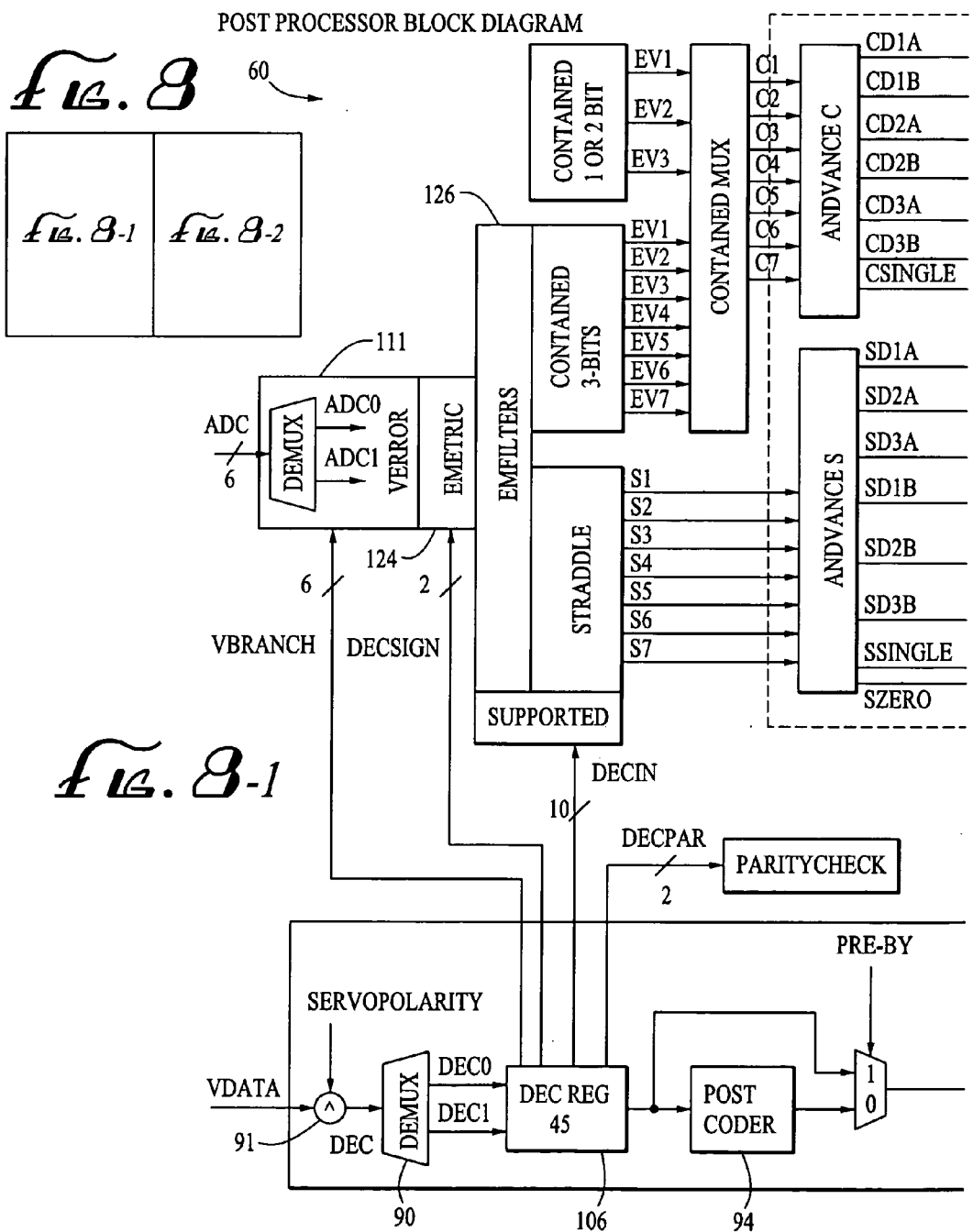

TWO STAGE DETECTOR HAVING VITERBI DETECTOR MATCHED TO A CHANNEL AND POST PROCESSOR MATCHED TO A CHANNEL CODE

CROSS REFERENCE TO RELATED APPLICATION

This is a divisional of U.S. patent application Ser. No. 09/352,160 filed Jul. 12, 1999 now U.S. Pat. No. 6,732,328. The entire disclosure of U.S. patent application Ser. No. 09/352,160 is incorporated herein by reference.

FIELD OF THE INVENTION

This invention relates to the detection of information within a sampled data detection channel, such as a magnetic recording and playback channel. More particularly, the present invention relates to a first stage maximum likelihood detector implementing the Viterbi detection algorithm adapted only to channel characteristics, and a second stage post-processor adapted to check and correct detection results based upon an embedded channel code imposed on the information within the channel by a channel code encoding process.

BACKGROUND OF THE INVENTION

A partial response maximum-likelihood (PRML) channel with Viterbi detection is a high performance architecture used for detection of a signal e.g. read from a magnetic recording medium. PRML permits magnetic transitions to be placed closer to one another than heretofore (increased intersymbol interference) and thereby enables higher magnetic transition recording densities than have been obtained with prior peak detection approaches. In PRML the magnetic recording channel is equalized to a partial response channel with known intersymbol interference. Then, a Viterbi detector is used to determine the most likely recorded sequence. Noise added into the partial response channel could cause detection errors at the output of the Viterbi detector.

User data to be recorded upon a magnetic storage medium is typically recorded in substantial blocks, each block comprising a predetermined number of bits such as approximately four thousand information bits. In order to protect against channel/detector errors, an outer error correction code (ECC) process, typically implementing a Reed-Solomon code, considers the sequence of these information bits to comprise a single ECC code word, or several ECC interleaved code words. The outer ECC process calculates and appends a predetermined number of ECC check bytes onto the user data block or block ECC interleave. On playback from the recording channel, the ECC check bytes are analyzed in order to detect and correct one or several error burst sequences within the user data block or interleave. It may be the case, particularly at high recording densities, that so many errors are made in the detection process that the outer ECC process is overwhelmed and becomes incapable of locating and/or correcting all of the error bursts.

Adding an inner or embedded channel code to each ECC protected user data block can improve channel detection performance by reducing the number of detector errors reaching an input of the ECC decoding and correction process. Implementing a channel code that provides performance gain at high code rate has previously resulted in a Viterbi detector requiring a very complex implementation, since prior Viterbi detectors have been matched to both the channel characteristics and to the channel code constraints.

The Viterbi algorithm is an iterative process of keeping track of the path with a smallest accumulated metric leading to each state of a detection trellis (graph). The metrics of all of the paths leading into a particular state are calculated and compared. Then, the path with the smallest metric is selected as the survivor path. In this manner all paths which can not be part of the minimum metric path through the trellis are systematically eliminated. The survivor path to each state is stored in a path memory. Given that the path memory is made sufficiently long, all of the survivor paths will diverge from a single path within the span of the path memory. The single path from which all of the current survivor paths diverge is the minimum metric path. The input sequence associated with this path appears at the output of the Viterbi detector.

There are two forms of prior art which are generally relevant to the present invention. The first form of prior art and the thing that has most commonly been employed in magnetic recording is a simple run length coding process that is not meant to detect errors (a code which ensures that magnetic flux transitions happen sufficiently frequently in order to provide reliable channel timing and gain control based on the incoming coded data pattern). This is the most common prior art. And in this first case the Viterbi is not necessarily matched to the code, because the code is not providing error detection or correction capability. The other form of prior art employs a code that can detect and correct errors, and in this second example the number of states and path lengths required of a Viterbi detector trellis are matched to both the channel and the code, see e.g. R. Karabed and P. Siegel, "Matched Spectral-Null Codes for Partial-Response Channels", *IEEE Transactions on Information Theory*, Vol. 37, No. 3, May 1991, pp. 818–855.

The squared Euclidean distance between two noiseless paths along the detector trellis is equal to the sum of the squares of the differences between the ideal samples on the two paths. In the case of independent and identically distributed Gaussian noise added to the channel, the most-likely errors made by the Viterbi detector correspond to mistaking two sequences that are separated by the minimum distance. As a consequence the minimum squared Euclidean distance can be used to estimate the probability of error at the output of the Viterbi detector.

Channel noise can cause errors at the output of the Viterbi detector. Errors may be more likely to occur at higher magnetic recording densities. User information may be more reliably recovered from the high density (high data rate) magnetic recording channel by incorporating an appropriately designed channel code. In the past, many channel codes have not achieved significant performance gains because of low code rate and because the code may not have been optimized for the error-events or error patterns that are most likely to occur within a particular partial response channel. In the early development of partial response signaling, maximum likelihood detection within a recording channel, channel code rates were typically 8/9. Later codes had higher rates, such as 16/17 and 24/25. At the same time, channel developers were considering detector trellis codes which had the desirable property of detecting and correcting error-events. Early trellis codes had a rate of 8/10 or 16/19, for example. While rates were slowly increasing for trellis codes, they generally had a lower code rate than more efficient codes which were not useful for detecting or correcting error-events.

One example of a Viterbi detector which matched a modulo-N trellis code on a partial response channel is described in Fredrickson U.S. Pat. No. 5,257,272, the disclosure thereof being incorporated herein by reference. In that patented approach a Viterbi detector replicated a conventional trellis structure for the channel N times. The N copies of the channel response trellis were interconnected such that a predetermined function associated each state in the trellis with a particular integer value modulo-N. The number N and the predetermined function were selected in accordance with channel detection and coding constraints, such that diverging erroneous sequences of minimum distance led to detector states which were distinct. The detector trellis was time-varying such that only certain values of the preselected function were allowed every m bits. The time-variation was said to assure that there were no minimum distance extensions of erroneous sequences beyond a predetermined length. One drawback of the Fredrickson '272 patent approach was its relatively complex Viterbi detector structure.

The number of states in a Viterbi detector matched only to the channel is equal to $M=2^{L-1}$, where L is the length of the partial response, i.e. the span of non-zero terms. For a (1–D) dicode channel the number of Viterbi states is 2. For a $(1-D)(1+D)^2$ EPR4 channel, the number of states is 8. Channels that provide better performance at higher densities tend to have even more states. When a modulo-7 code is used on a channel with M states, the combined Viterbi detector has 7M states. As the number of states in the channel increases, the complexity of the combined detector increases seven-fold.

An example of a Viterbi detector followed by a post-processor is described in co-inventor Kelly Knudson Fitzpatrick's U.S. Pat. Nos. 5,521,945 and 5,689,532, both of which are commonly assigned with the present patent. The disclosures of the '945 and '532 patents are incorporated herein by reference thereto. The described post-processor employed certain information from a Viterbi detector optimized to a PR4 target spectrum in order to produce an estimated input sequence which approached a maximum likelihood sequence estimate for an EPR4 channel target.

A hitherto unsolved need has remained for a reduced-complexity detection architecture and method for detecting information in a partial response channel characterized by more complex transfer polynomials and use of error detecting channel codes having high code rates, and by using a Viterbi detector tuned to the channel transfer function followed by a post-processor responsive to the channel code and having a relatively simplified implementation.

SUMMARY OF THE INVENTION WITH OBJECTS

A general object of the present invention is to provide a two-stage detection architecture and method for a partial response channel which overcomes limitations and drawbacks of the prior art.

More particularly, an object of the present invention provides a detection architecture and method for increasing the performance of a partial response channel by correcting most likely error-events in a way that is not too complicated.

Another more specific object of the present invention is to provide a two-stage detection architecture including a first-stage Viterbi detector tailored to characteristics of a partial response channel and a second-stage post-processor tailored to characteristics of a channel code for checking and correcting incoming sequence estimates of the Viterbi detector.

A further object of the present invention is to provide an improved two-stage detection architecture for a magnetic recording and playback channel which may be practically implemented in a read channel large scale integrated circuit chip.

One more object of the present invention is to provide a method for obtaining high rate channel codes which are optimized for error-events which occur in a particular partial response channel and imposing those codes on information passing through the channel in a manner which enables a first-stage Viterbi detector to be tailored solely to the characteristics of the partial response channel and a second-stage post-processor which corrects detected sequence estimates provided by the Viterbi detector with decision metrics information relating to decision accuracy of the Viterbi detector and by reference to the channel code, its characteristics, constraints and known likely error-events, the inventive method being accomplished in a manner overcoming limitations and drawbacks of the prior art.

As a related object of the present invention, a preferred channel code comprises either a predetermined modulo-n code, an interleaved parity code, or a cyclic code having a rate (R) greater than $(2^P-1-p)/2^P-1$ where p is equal to the number of parity bits.

As another related object of the present invention, a two-stage detection architecture for a partial response channel detects and corrects multiple error-events occurring within a single user data word or an error event spanning adjacent user data words, in a manner overcoming limitations and drawbacks of the prior art.

In accordance with principles of the present invention, a two-stage sampling data detector is provided for a partial response channel. The channel, which may be a magnetic digital data recording and playback channel, such as including a disk drive or tape drive, has a channel code encoder for encoding user information sequences into blocks of code words in accordance with a predetermined channel code. The channel code is characterized by a list of most likely error-events comprising impermissible code words. In preferred form the channel code comprises a predetermined modulo-n code, an interleaved parity code, or a cyclic code having a rate (R) greater than $(2^P-1-p)/2^P-1$, where p is equal to the number of parity bits. The detector includes a first-stage detector, preferably although not necessarily a Viterbi detector, connected to receive samples from the partial response channel. The first-stage detector, being matched to characteristics of the channel and not matched to the channel code, puts out unchecked bit estimates. A second-stage post-processor is connected to receive the unchecked bit estimates and develops decision metrics information from the samples and from the unchecked bit estimates. The second-stage post-processor puts out post-processed bit estimate sequences to a channel code decoder after checking and correcting said sequences in accordance with the decision metrics information and channel-code information including the list of most likely error-events. In one preferred form the second stage post-processor includes a sequence checker for checking sequences of the unchecked bit estimates to detect a violation of the channel code, and a sequence corrector responsive to a detected channel code violation and to the decision metrics information for determining a nearest code word in squared Euclidean distance and for putting out the nearest code word in place of the unchecked bit estimate sequence.

These and other objects, advantages, aspects and features of the present invention will be more fully appreciated and understood upon consideration of the following detailed

DETAILED DESCRIPTION OF PREFERRED EMBODIMENTS

Figures 1, 6:
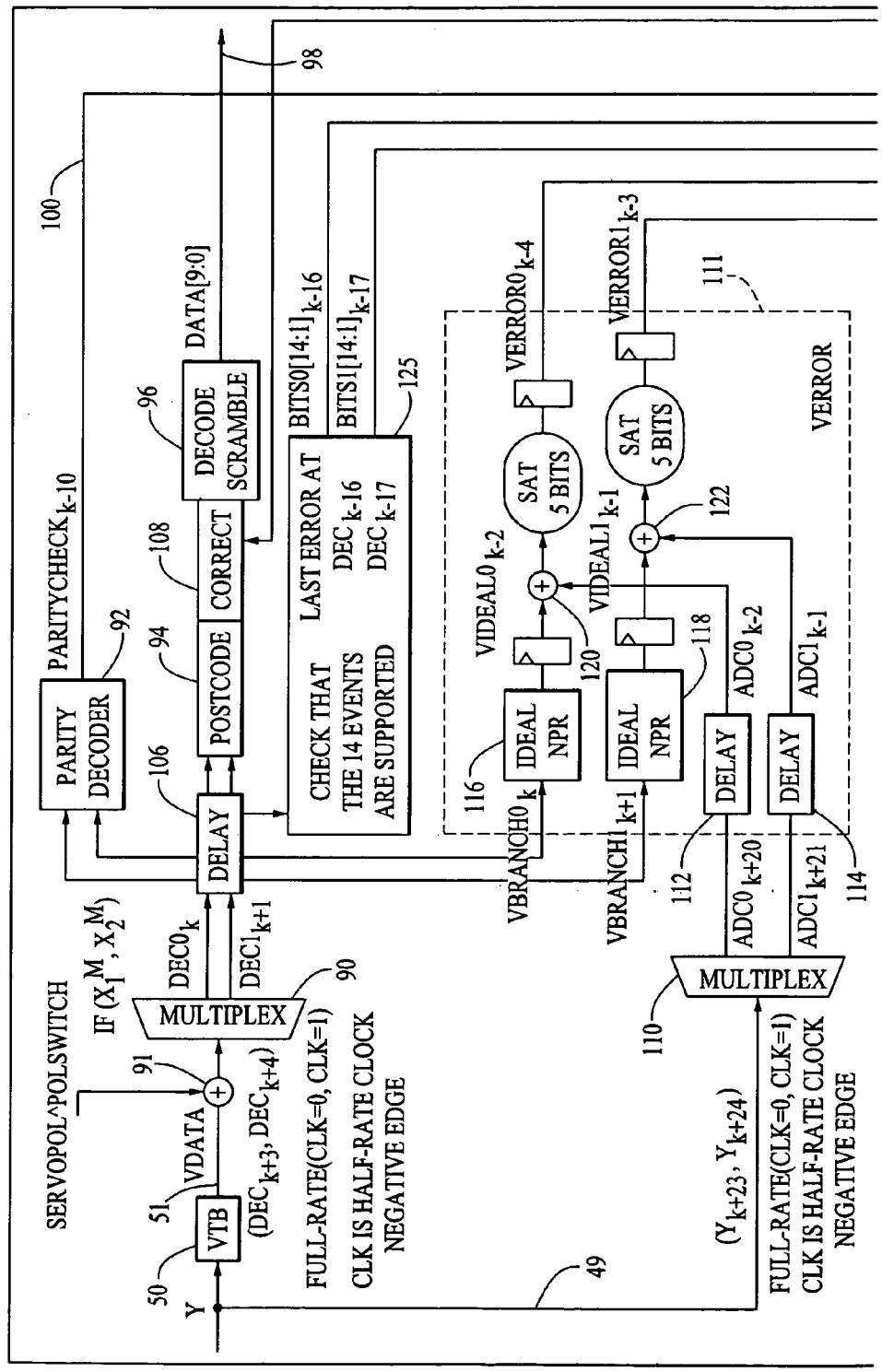
FIG. 1 is a simplified block diagram of a partial response channel, such as a magnetic recording and playback channel, in accordance with established principles of the prior art.
FIG. 6 is a structural block diagram of a post-processor for correcting Viterbi detector estimates based upon a parity code.

In order to better understand and appreciate principles of the present invention, a conventional partial response channel is described in connection with the FIG. 1 block diagram. In FIG. 1 an information bus 10 supplies digital values to an error correction code (ECC) encoder 12. The encoder 12 processes a user data block, having a predetermined block length such as e.g. approximately 4096 bits, and generates and appends certain ECC 8 or 10 bit length redundancy symbols onto the user data block, depending upon a particular ECC algorithm being implemented, such as a Reed-Solomon code. The user block ECC algorithm is conventional, is well understood by those skilled in the art, and is not described in further detail in connection with the present invention. The user data values including the appended ECC redundancy symbols are passed to a channel code encoder 14 wherein the user data values and ECC symbols are further encoded in accordance with a predetermined channel code having a known code rate to produce a stream or sequence of channel-coded values. The known channel code has a predetermined code rate such as 8/9, or higher. The channel-coded values are then passed through a partial response channel 16 having a predetermined channel characteristic h(D), where D is a unit delay operator. In the FIG. 1 example, the channel characteristic may be a dicode or (1−D) channel, a PR4 channel, an EPR4 channel, or an $E^2PR4$ channel, for example. Gaussian noise ($n_k$) is added into the channel 16, as symbolized by the summing junction 18 (which could be shown ahead of the channel 16 instead of the FIG. 1 depiction in which the noise-summing junction 18 follows the channel 16).

Noisy samples of the user data sequence are received and processed by a Viterbi detector 20 which detects and puts out most likely estimates of the user data samples. In the FIG. 1 example, the Viterbi detector 20 may be matched to the channel only, or it may be matched to the channel transfer function and to an error detection code as well, as in the examples provided in the Karabed and Siegel paper referred to above. A channel code decoder 22 removes the channel code to produce ECC encoded user data estimates, and an ECC decoder process 24 checks the estimates and corrects any data block error bursts within the correction capability of the particular ECC strategy and puts out checked estimates of the original user data onto a user data bus 26.

Figures 2, 8:
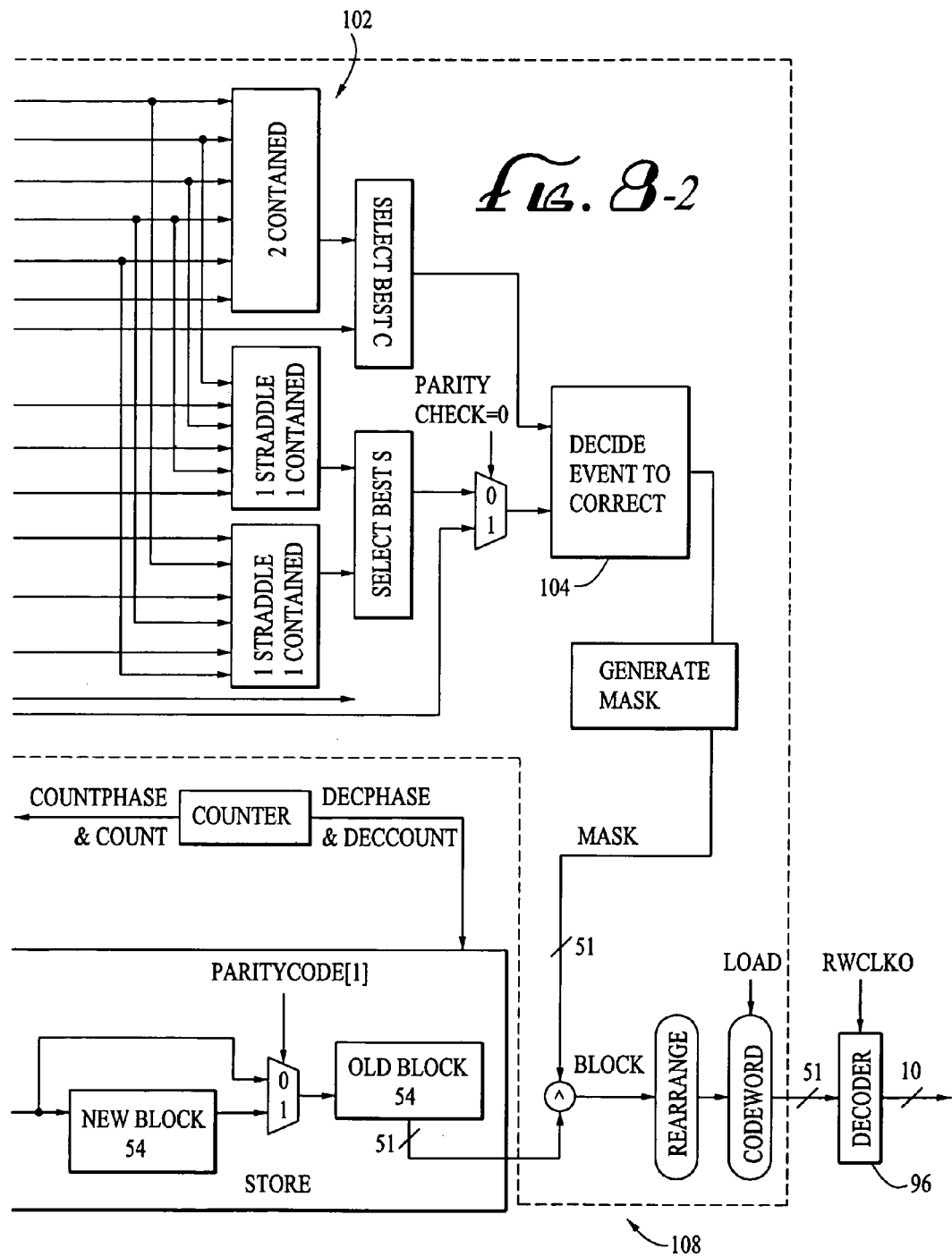
FIG. 2 is a block diagram illustrating a partial response channel departing from the prior art channel of FIG. 1 by inclusion of a two-stage detector including a first-stage Viterbi detector tailored to the characteristics of the partial response channel and a second-stage post-processor enabled by a high rate channel code which checks and corrects sequence estimates provided by the Viterbi detector, in accordance with principles of the present invention.
FIG. 8 is a more functional flow block diagram of the FIG. 6 post-processor, illustrating data flow paths therewithin.

Referring now to FIG. 2, a channel system in accordance with principles of the present invention is shown in overview wherein the same elements of the FIG. 1 depiction are given the same reference numerals. A partial response channel includes a source of user data, such as bus 10. User data blocks of known length (e.g. 4096 bits or 512 8-bit bytes) are passed through an ECC block encoder 12 which appends ECC redundancy symbols onto the user block in accordance with a predetermined (conventional) ECC strategy and then passes the ECC encoded block into a modulation code encoder 13.

The modulation code encoder 13 most preferably implements a derived high rate modulation code, such as a rate 48/49 code, or a rate 50/51 code, and puts out modulation encoded words to a channel code encoder 15. The channel code encoder 15 imposes a parity code, 1–3 bits upon each 49 or 51 bit modulation code word. The channel coded words are then passed through a partial response channel 17 in which noise $n_k$ is added as at node 18. A flash analog-to-digital converter 48 synchronously samples the noisy channel signal and provides noisy samples to a channel-matched Viterbi detector 50 and to a channel-code matched post-processor 60 (which also includes the channel code and modulation code decoder functions). An ECC block decoder 24 receives decoded user data blocks, and checks the ECC redundancy symbols to see if any ECC block error correction is needed, and if so, makes the needed error correction and passes the user data blocks onto a data bus 26. An embedded data controller 30, such as a programmed microprocessor, controls operations of the channel (e.g. drive) via a control bus 32.

In accordance with principles of the present invention, a high rate channel modulation code is imposed upon incoming data values (including appended ECC syndrome information) by the encoder 13 to produce modulation coded data. Then, a parity code is superimposed on the modulation coded data by a channel code encoder 15 to produce channel coded data. In one example, the channel modulation code has a rate 48/49, meaning that a 49 bit code word is generated for each 48 bit user data sequence (including the appended ECC symbols). In another example, a 50/51 code has a 51 bit code word generated for each 50 bit user data sequence. One, two or three parity bits are added to the channel modulation code by the channel code encoder 15 in producing the channel coded data. Thus, with three parity bits, the 48/49 code becomes a rate 48/52 channel code, and the 50/51 code becomes a rate 50/54 channel code. A 48 bit data word is preferred for use with channels having an 8 bit data controller 30 whereas a 50 bit data word is preferred for use with channels having a 10 bit data controller 30.

The channel code is derived such that it enables post-processing within the channel-code-matched post-processor 60 which carries out detection and correction of minimum distance error-events occurring in the estimates provided by the Viterbi detector 50 by making effective use of the channel code. Derivation of a suitable channel code is described later on in connection with FIG. 10. The encoded values are passed through a partial response channel 17 to which noise is added, as at a noise combining node 18. The partial response is preferably, although not necessarily, a high density magnetic recording and playback channel, such as a magnetic hard disk drive or a magnetic tape drive which has, for example, a predetermined amount of intersymbol interference.

As one example, the high density magnetic recording and playback channel 17 may have a channel transfer function or characteristic H(D) which most preferably may be in accordance with a "new partial response" target (NPR) (which has a discrete time transfer function of $14+8D-8D^2-10D^3-4D^4$). Further details of the NPR channel target may be found in U.S. patent application Ser. No. 09/034,933 filed on Mar. 4, 1998 by Fisher et al. for "Partial Response Target and Detector for Magnetic Recording and Playback Channel", the disclosure thereof being incorporated herein by reference thereto. The present invention provides improvements for a wide variety of channel shapes and characteristics, and for a wide variety of high rate channel codes. However, NPR has been found to provide a good match to a high density magnetic recording channel, over EPR4, for example. By using the NPR target, less channel equalization loss is experienced. Accordingly, channel shaping in accordance with NPR is presently preferred. However, it will be understood and appreciated by those skilled in the art that other partial response channel targets may be used to great advantage and improvements realized by adopting and using principles of the present invention. This new architecture and method works well for any partial response channel having a known shaping, but not a particular shaping; and, a method of the present invention yields a channel code by a process of detecting occurrences of error-events in the particular channel and by designing and employing a channel code that detects these particular error-events.

In accordance with principles of the present invention, a digital sampler, such as flash A/D 48, provides synchronous raw (noisy) digital NPR channel samples to a Viterbi detector. The Viterbi detector 50 is most preferably tailored solely to the characteristics of the high density partial response channel 17, and without regard to the channel code imposed by the encoding process of the channel code encoder 15. By matching the Viterbi detector 50 to the characteristics of the channel 17 only, and by not taking into account the channel code at the Viterbi detector, the Viterbi detector 50 may be vastly less complex than otherwise.

In matching the Viterbi detector to the NPR partial response channel 17, if the length of the channel is L, the Viterbi detector 50 will require $2^L-1$ states (it being understood that the length of the channel is the span of the non-zero terms, i.e. the largest span from a non-zero term to the next non-zero term in a sequence). For an NPR channel having a channel length L of 5, such as partial response channel 17, the Viterbi detector 50 matched solely to that channel target has 16 states. In comparison, if one were to implement a Viterbi detector matched to a modulo-7 channel code on an NPR channel, the required number of states would be 112. When a three-bit cyclic code (see infra) is used, the required number of states for a Viterbi detector matched to the NPR channel and to the code is 128.

The Viterbi detector 50 puts out its unchecked samples of the encoded channel data. Since the channel code is not considered by the Viterbi detector 50, the estimates may include error-events. The unchecked sample estimates are then passed into the post-processor 60 on a path 51 in accordance with principles of the present invention. The post-processor 60 checks to see whether received sequences violate the channel code by including one or more error-events. If there are no error-events, the values are passed through a channel code decoding process and a parity checking process most preferably embedded within the post-processor 60. If an error-event is detected, the sequence is corrected within the post-processor 60 such that the most likely error-event or combination of error-events is corrected in a manner satisfying the channel code constraints. In other words, the result of the correction process yields a valid code word in lieu of the code-violating sequence.

There are certain known properties of the desired channel code. The channel code desirably possesses a structure such that it is particularly adapted to certain error-event patterns more likely to occur in the particular channel 17. The code is designed such that out of every pair of nearest neighbor sequences (in the sense of minimum Euclidean distances), at least one member of the pair is disallowed by the particular channel code. Putting it another way, for every pair of nearest neighbor sequences which are separated by the known likely error-events, if one sequence of the pair is used as a code word, the other sequence of the pair is not permitted to be a code word within the channel code.

A list of most likely error-events is developed from the characteristics of the particular channel, and the channel code is designed such that the error-events of the list are detectable by the post-processor 60. The list of most likely error-events enables one to know which of those error-events in which locations would result in a valid code word, given the properties of the particular channel code. In the case of the preferred NPR channel 17, the following list of seven error-events represents most likely to occur error-events: +, +−+, +−, +−+−, +−+−+, +0+, and +00+; wherein + symbolizes a logical one in lieu of a logical −1, and − symbolizes a logical −1 in lieu of a logical 1. This list of most likely error-events is therefore preferably used by the post-processor 60 in determining the nearest code word to the detected particular error-event.

It should be noted in passing that if a particular error-event occurs at a location such that the error-event results in a valid code word, such error-event becomes undetectable by the post-processor 60 at that particular location. In such case, error-event detection, location, and correction must be handled by a higher level process not directly a part of the present invention, such as by the ECC strategy implemented at ECC block encoder 12 and ECC block decoder 24 within the overall channel system.

Because of the possibility that some error-events could cross code word boundaries, the post-processor 60 most desirably will be able to handle multiple code word blocks at a time. The corrected code word sequence is then passed out of the post-processor 60 and becomes the best or "most likely" sequence estimate. Thereafter, a modulation code decoder tailored to the particular high rate channel code imposed by the encoder 15 removes the vestiges of the channel modulation code thereby to produce ECC coded sample estimates. Since the post-processor 60 may not have actually chosen the correct nearest code word in some rare circumstances of error disturbance in channel 17, the ECC decoder 24 is used to locate and make those corrections in a conventional manner. A channel controller 30 and a channel control bus 32 interconnect various elements of the channel 17 such as the post-processor 60, and ECC decoder 24, etc., in order to provide overall process control and data flow synchronization in a manner well known to those skilled in the art.

Channel Codes and Encoder 15

Since the modulation code is further encoded with a one to three bit parity code, and the overall code rate must still be quite high, high rate modulation codes are preferred. In order to achieve high rates, the modulation codes have very long block lengths. When the post-processor 60 is supervised by a ten-bit controller 30, a rate 50/51 modulation code is supported. If the controller 30 is eight-bit, then a rate 48/49 run-length-limited (RLL) modulation code is supported. For the rate 48/49 code, each modulation block contains six 8-bit symbols. For the rate 50/51 code, each modulation block contains five 10-bit symbols.

Most preferably the channel codes comprise a predetermined modulo-n code, an interleaved parity code, or a cyclic code having a rate (R) greater than $(2^p-1-p)/2^p-1$, where p is equal to the number of parity bits. In addition, the predetermined code is selected such that a list of most likely error-events is developed. The list comprises error-events which are detectable as such by the particular code, i.e. such error-events, upon detection, produce impermissible code words. Examples of modulo-n codes meeting these criteria are found in Fredrickson U.S. Pat. No. 5,257,272, referenced and incorporated hereinabove.

In order to improve performance, some additional parity bits are appended to the end of each modulation block during the encoding process performed by the channel code encoder 15. Most preferably, the channel code encoder 15 may be program-controlled to append 0, 1, 2, or 3 parity bits. Although the overall code rate decreases as the number of parity bits increases, the coding gain increases.

Figure 3:
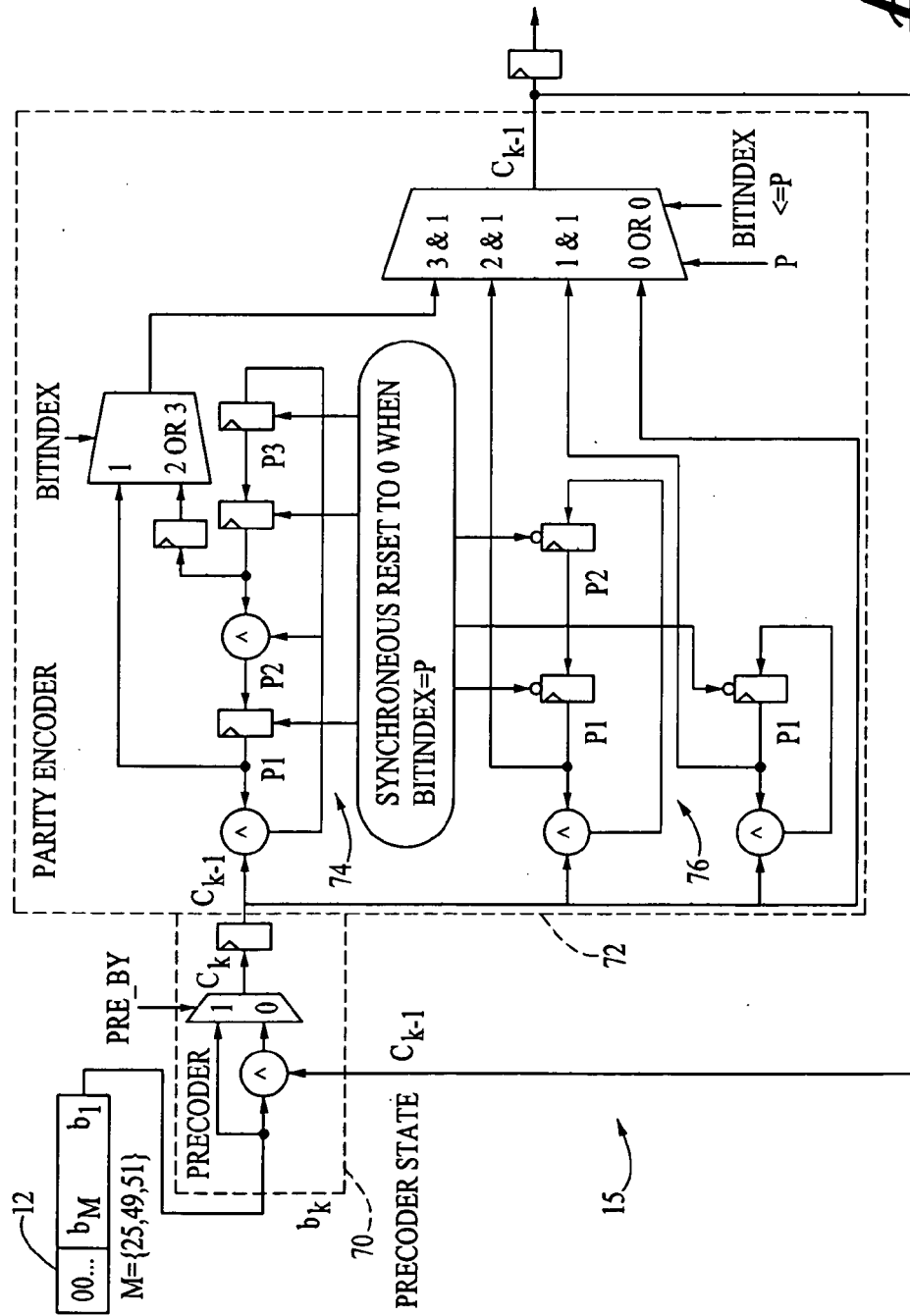
FIG. 3 is a more detailed block diagram of a precoder and parity encoder for parity coding user data blocks passing through the FIG. 2 partial response channel architecture.

FIG. 3 sets forth a detailed block diagram of a channel code encoder 15 included within the FIG. 2 channel system. The encoder 15 includes a precoder 70 and a parity encoder 72. The precoder 70 is conventional and typically precodes user data as a function of the incoming ECC encoded sequence and a precoder state taken from the encoded output of parity encoder 72.

Since the parity bits do not pass through the precoder 70, the parity codes are polarity dependent. Actually, the one-bit parity code happens to be polarity independent, since the modulation code plus parity block length N (e.g. 50 or 52 bits) is an even integer. The two-bit and three-bit parity codes require that the polarity be controlled during writing through the channel 17, and that the polarity be known during playback from the channel 17. The parity bits are appended to the end of an encoded and precoded modulation code block of data.

Assume a polynomial C(x) represents the entire block, $C(x)=c_N+c_{N-1}x+c_{N-2}x^2+ \ldots +c_1x^{N-1}$, and $\alpha(x)$ represents the block without the parity bits, $a(x)=c_M+c_{M-1}x+c_{M-2}x^2+ \ldots c_1x$. In accordance with this assumption, with a one-bit parity code, the parity bit is simply the complement of the modulo-2 sum of the bits in the RLL encoded word after preceding, i.e. $C_{M+1}=1+\alpha(1)(\mod 2)$. The single parity bit is capable of detecting greater than 80 percent of all known error-events including +, +−+, +−+−+, and others.

When two parity bits are appended, a two-way interleaved parity code (IPC) is realized in which one parity bit is the complement of the modulo-2 sum of the even bits in the RLL encoded word after the precoder and the other parity bit is the complement of the modulo-2 sum of the odd bits, i.e.: $c_{M+1}=(1+((\alpha(1)-\alpha(-1))/2))(\mod 2)=1$ XOR $c_{M-1}$ XOR $c_{M-3}$ XOR $c_{M-5}$ XOR $\ldots$ $c_{M+2}=(1+((\alpha(1)+\alpha(-1))/2))(\mod 2)=1$ XOR $c_M$ XOR $c_{M-2}$ XOR $c_{M-4}$ XOR $\ldots$ . With the two-bit IPC is used, detection capability exceeds 95 percent of all known error-events and includes detecting error-events +, +−+, +−, +−+−+, +00+, and others. In addition, the two-bit IPC can detect approximately two-thirds of the cases of double error-events within the same modulation code data block. The post-processor 60 therefore considers cases of two error-events in the same block as well as error-events crossing code block boundaries.

When the parity code comprises three bits, a cyclic parity code is realized. The three parity bits are computed by finding $\beta(x)$ which is the remainder of $\alpha(x)x^3$ divided by $g(x)=1+x^2+x^3$. Therefore, the remainder of the parity encoded block $C(x)=\beta(x)+\alpha(x)x^3$ divided by $g(x)$ is zero. The three-bit parity encoder 74 is thus a division circuit that calculates the remainder by feeding $c_1$ through $c_M$ through the registers of the LFSR. After all M bits have been clocked in (i.e. when BITINDEX=1), the state of the LFSR 74 provides the three parity bits, $\beta(x)=p_3+p_2x+p_1x^2$, $c_{M+1}=p_1$, $c_{M+2}=p_2$, and $c_{M+3}=p_3$. These bits are then appended to the modulation code block and result in the parity channel code block which is passed through the partial response channel 17.

For a three-bit cyclic parity code there are seven non-zero syndromes. Each detectable error-event has a distinct syndrome for each location that is distinct mod 7 (a property of a primitive irreducible polynomial). Therefore, the post-processor 60 can detect six out of seven of the cases of two error-events occurring within the same block, and the probability of miscorrection is reduced by approximately seven fold.

Channel-Matched Viterbi Detector 50

The preferred partial response channel 17 equalizes e.g. a magnetic read back waveform into the desired NPR signal. During data, the A/D converter 48 samples the analog magnetic read back waveform and imposes an offset constant of 0.5. The resultant A/D samples range from −26.5 to 26.5. The A/D sample put out by the sampler 48 is represented by Y[5:−1], where y[−1] is always equal to 1. The A/D samples consist of an ideal noiseless NPR sample plus a noise sample, or $Y_k=IDEAL_k+n_k$, the noise sample being added into the data stream as at summing node 18 in FIG. 2.

There are 19 distinct ideal values corresponding to $IDEAL_k=14x_k+8x_{k-1}-8x_{k-2}-10x_{k-3}-4x_{k-4}$, with $x_i$ being a binary input symbol equal to 0 or 1 and representing a non-return-to-zero (NRZ) write current at time i. At a time k, the state of the NPR channel corresponds to the last four binary input symbols and is denoted by $S_{k-1}$, or $[x_{k-4}, x_{k-3}, x_{k-2}, x_{k-1}]$ in binary notation. Since the NPR channel 17 has 16 possible states, the Viterbi detector 50 uses a 16-state trellis to detect the binary input sequence. All possible binary input sequences are represented as paths through the trellis.

Figure 4:
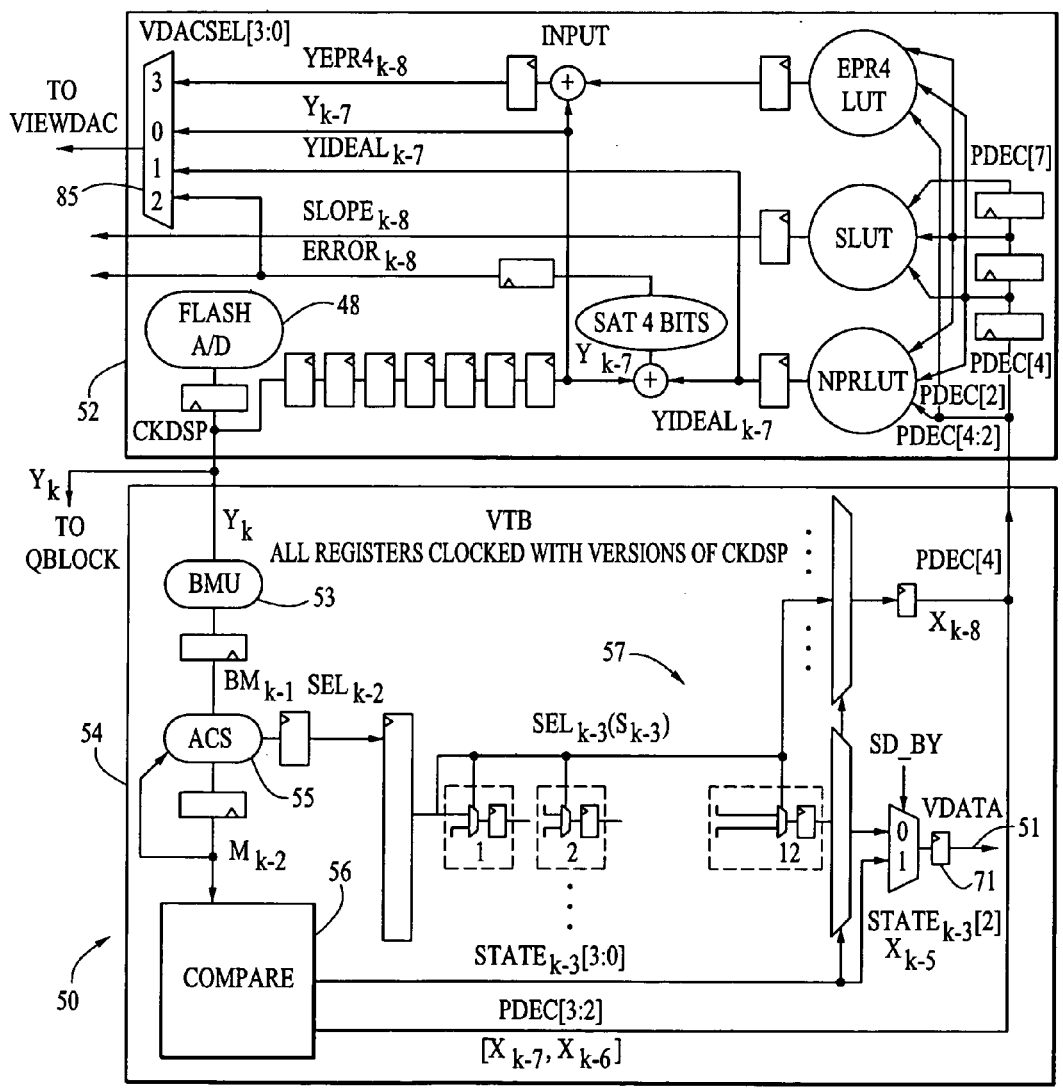
FIG. 4 is a block diagram of a Viterbi detector adapted solely to e.g. an NPR target and used within the FIG. 2 partial response channel.
Figure 5:
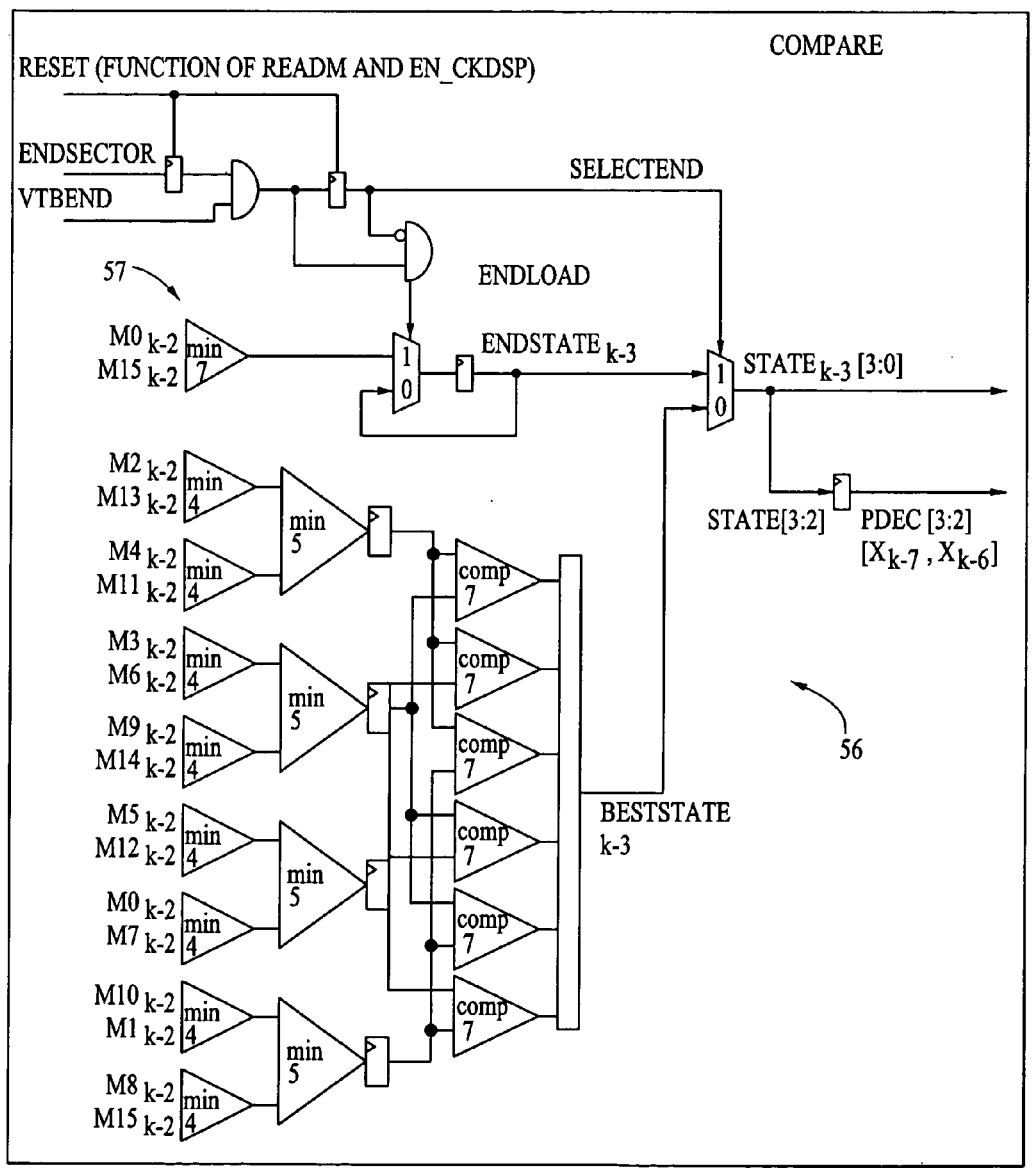
FIG. 5 is a block diagram of a compare circuit within the FIG. 4 Viterbi detector.

The Viterbi detector 50 selects the path with the noiseless ideal sequence that is closest in squared Euclidean distance to the noisy sample sequence. The Viterbi detector 50 of FIG. 2 includes an input unit 52 (FIG. 4), a Viterbi unit 54 (FIG. 4), and a compare unit 56 (FIG. 5). The Viterbi unit 54 further includes a branch metric unit 53, an add-compareselect unit 55 and a survivor memory path 57, in addition to the FIG. 5 compare circuit 56. The output of the survivor path memory 57 is the preliminary maximum-likelihood sequence estimate of the write current, or VDATA=$(x_i \text{ hat})_k$.

Post-Processor 60

FIG. 6 sets forth a detailed block diagram of a presently preferred embodiment of the post-processor 60. Data flow may be more fully appreciated by considering the functional flow diagram of FIG. 7 in light of the structural diagram of FIG. 6. The Viterbi detector 50, adapted only to the transfer function (e.g. NPR) of the partial response channel 17, directly provides initial most-likely estimates (VDATA) of the coded user data sequence via an output path 51. A time-division multiplexer 90 receives the initial estimates at the bit rate and divides the estimates into two half-rate data streams, an odd estimate stream, and an even estimate stream. A polarity control 91 forces the incoming data stream to a known correct polarity. The dual, half-rate data streams enable many elements of the post-processor 60 to be clocked at one-half of the bit rate in order to reduce power consumption in a large scale, application specific integrated circuit chip including at least the Viterbi detector 50 and the post-processor 60.

The odd and even estimate streams are applied to inputs of a parity decoder 92 which looks for parity errors, and for a syndrome if there are errors, in a particular modulation code block. If the parity checks, i.e. equals zero, then the initial estimates are the most likely correct estimates as checked by the channel code, and the post-processor 60 does not need to take any further corrective action, although a post-coder 94 embedded within the post-processor provides e.g. a (1 XOR d) function which reverses the effect of the precoder 70, and a modulation decoder 96 removes the predetermined channel modulation code (e.g. rate 48/49 or rate 50/51), thereby providing ECC-block encoded user data on an output path 98 leading to ECC block decoder 26. The descrambler function descrambles the data as an inverse of scrambling conventionally occurring as a part of the data encoding processes. Even when there is no detected error event; the correction block 108 will remove the channel code parity bits, leaving the modulation code block format remaining.

However, if the parity doesn't check on a channel code sequence encoded with one of the channel codes there will be information available about what types of errors may have occurred, and that information comes out of the parity check block 92 via a syndrome path 100. The syndrome path 100 leads into a "best contained event and best straddling event" block 102, and also into a "best event" block 104.

A data path directly through the post-processor 60 from the multiplexer 90 includes a delay matching block 106, the post-coder 94, a correction block 108, and the channel code decoder (descrambler) block 96. The delay-matching block 106 provides necessary process delay matching for the various processing functions of the post-coder 60. The correction block 108 is where error event correction is carried out, which occurs before the estimates reach the decoder 96. In the absence of an error event, the operative path for initial estimates through the post-coder 60 is simply from the Viterbi 50 through the multiplexer 90, delay match 106, post-coder 94, correction block 108, and the decoder 96.

However, if a parity violation is detected at the parity decoder block 92, a plurality of processing steps occur within the post-processor 60. There are several process paths. One path 49 brings in the analog to digital NPR samples from flash A/D 48 which are obtained upstream of the Viterbi 50 but most preferably after some channel equalization filtering, as with an analog equalizer or a digital FIR filter within the partial response channel 17. These equalized NPR samples are then passed through a second time-division multiplexer 110 to produce two streams: odd and even half rate NPR samples. These two streams are then applied to a Viterbi error block 111. The Viterbi error block 111 reconstructs decision metrics information relating to the Viterbi decision process underlying the particular VDAA value undergoing post-processing error evaluation.

Within the VERROR block 111, delay lines 112 and 114 in the odd and even NPR sample paths respectively provide $ADC0_{k-2}$ and $ADC1_{k-1}$ delayed NPR samples. In another set of blocks 116 and 118 labeled "Ideal NPR", ideal NPR samples are derived from delay-matched decision estimates received from the Viterbi detector 50. At difference nodes 120 and 122, a difference is taken between the ideal, noiseless NPR samples from blocks 116 and 118 and the delayed actual NPR channel samples via the delay matching blocks 112 and 114, respectively. The resulting differences provide Viterbi decision error metrics for the even and odd half-rate processing paths, $VERROR0_{k-4}$ and $VERROR1_{k-3}$, respectively.

An error metric block 124 takes in the half-rate Viterbi error values $VERROR_{k-4}$ and $VERROR_{k-3}$, and calculates values that are proportional to the error-event metric for an error-event comprising a single bit error at $x_{k-13}$, $EMET1_{k-13}$, and a single bit error at K–12, $EMET0_{k-12}$. A constant –7 is added to these values in the error-metric filters block 126 to obtain the actual error-event metrics for a single bit error. The error metric block 124 uses 6-bit saturating adders at every stage. The output of the error metric block 124 is a convolution of the NPR target with the Viterbi error VERROR, in accordance with:

$$EMETk = (-1)^{VDATA_k}\{1.75\ VERROR_k + VERROR_{k+1} - VERROR_{k+2} - 1.25\ VERROR_{k+3} - 0.5\ VERROR_{k+4}\}.$$

Actual circuit implementation uses truncation in the multiplications and then adds in 1 to account for the bias introduced by the truncation, in accordance with:

$$EMETk = (-1)^{VDATA_k}\{(VERROR_k[4:0] << 1) - (VERROR_k[4:0] >> 2) + VERROR_{k+1}[4:0] - VERROR_{k+2}[4:0] - VERROR_{k+3}[4:0] - (VERROR_{k+3}[4:0] >> 2) - (VERROR_{k+4}[4:0] >> 1) + 1\}.$$

The resultant error metric ($EM1\_0_{k-12}$, $EM1\_1_{k-13}$) is within plus or minus one least significant bit of the true value, assuming that the saturation level for the adders and for the input VERROR sequence have not been exceeded. A control is provided to assure correct sign of the error-metric.

The error-metric filters block 126 takes in each half-rate Viterbi error-event metric for a single error-event, EMET0k–10 and EMET1k–11, and outputs half-rate error-event metrics for 14 different types of error-events. If the error-event is not supported in the Viterbi detector output as tested by a check block 125, then the metric is set to a minimum value of –32. The larger the metric the more likely the error-event. The filters block 126 filters the error-event metric for each type of error-event and then adds a constant. The filters block 126 preferably uses 6-bit saturating address at every stage.

There are 14 types of error-events, and the corresponding error-event metric for each is as follows:

| Error Position | Error-Event Metric |
|---|---|
| k − 7 ... k | |
| 1 | + EM1$_k$ = DM1$_k$/16 − 20.5 = EMET$_k$ − 7. |
| 2 | −+ EM2$_k$ = DM2$_k$/16 − 20.5 = EMET$_k$ + EMET$_{k−1}$ − 13. |
| 3 | +−+ EM3$_k$ = DM3$_k$/16 − 20.5 = EMET$_k$ + EMET$_{k−1}$ + EMET$_{k−2}$. |
| 4 | −+−+ EM4$_k$ = DM4$_k$/16 − 20.5 = EMET$_k$ + EMET$_{k−1}$ + EMET$_{k−2}$ + EMET$_{k−3}$ − 8. |
| 5 | +−+−+ EM5$_k$ = DM5$_k$/16 − 20.5 = EMET$_k$ + EMET$_{k−1}$ + EMET$_{k−2}$ + EMET$_{k−3}$ + EMET$_{k−4}$ − 9. |
| 6 | −+−+−+ EM6$_k$ = DM8$_k$/16 − 20.5 = EMET$_k$ + EMET$_{k−1}$ + EMET$_{k−2}$ + EMET$_{k−3}$ + EMET$_{k−4}$ + EMET$_{k−5}$ − 10. |
| 7 | +−+−+−+ EM7$_k$ = DM8$_k$/16 − 20.5 = EMET$_k$ + EMET$_{k−1}$ + EMET$_{k−2}$ + EMET$_{k−3}$ + EMET$_{k−4}$ + EMET$_{k−5}$ + EMET$_{k−6}$ − 11. |
| 8 | −+−+−+−+ EM8$_k$ = DM8$_k$/16 − 20.5 = EMET$_k$ + EMET$_{k−1}$ + EMET$_{k−2}$ + EMET$_{k−3}$ + EMET$_{k−4}$ + EMET$_{k−5}$ + EMET$_{k−6}$ + EMET$_{k−7}$ − 12. |
| 9 | + 0 + EM9$_k$ = DM9$_k$/16 − 20.5 = EMET$_k$ + EMET$_{k−2}$ − 14. |
| 10 | + 0 + 0 + EM10k = DM10$_k$/16 − 20.5 = EMET$_k$ + EMET$_{k−2}$ + EMET$_{k−4}$ − 15. |
| 11 | −+− 0 0 +−+ EM11$_k$ = DM11$_k$/16 − 20.5 = EMET$_k$ + EMET$_{k−1}$ + EMET$_{k−2}$ + EMET$_{k−5}$ + EMET$_{k−6}$ + EMET$_{k−7}$ − 13. |
| 12 | + 000 + EM12$_k$ = DM12$_k$/16 − 20.5 = EMET$_k$ + EMET$_{k−4}$ − 27. |
| 13 | + 0 0 +−+ EM13$_k$ = DM13$_k$/16 − 20.5 = EMET$_k$ + EMET$_{k−1}$ + EMET$_{k−2}$ + EMET$_{k−5}$ − 13. |
| 14 | + 0 0 + EM14$_k$ = DM14$_k$/16 − 20.5 = EMET$_k$ + EMET$_{k−3}$ − 13. |

In the best contained event and best straddling event circuit 102, the best error event that is contained within a channel code block and/or the best error event that straddles a channel code block boundary is determined and put out to the best event circuit 104. The difference metric for a particular error-event (DM$_k$(event)) is equal to the difference between the squared Euclidean distance along the error path and the squared Euclidean distance on the path selected by the Viterbi detector 50, in accordance with the expressions set forth in FIG. 7, wherein VDATA is the binary sequence at the output 51 of the Viterbi detector 50, "event" is a three-level error-event signal with levels 0, +1 and −1, H is the NPR channel response (H(D)=14+8D−8D$^2$−10D$^3$−4D$^4$), the circle multiple denotes a convolution function, and d(event)$^2$ is the square Euclidean distance of the error-event.

As a modulation code block is being processed through the post-processor 60, the parity for the current block is not presently available via the parity decoder 92. Therefore, it is necessary to save all of the bit patterns known to be potential error-events. Accordingly, the best contained event and best straddling event block 102 saves the best potential error event pattern and location for each parity value. In the case of the three bit code, there are seven non-zero parity (error syndrome) values, and so those are saved. While there are 14 types of error-events, it turns out that they pair up, and there are therefore seven parities that are of interest.

For each of the seven parities of interest there are two possible error-events that can have that parity at any given location within the modulation code block. At each bit location within the modulation code block there could be up to 14 different error-events, depending upon what the data pattern is. Therefore, some sorting is performed by the error-metric filter block 126 to see how a particular error-event compares with a best error-event of that parity that exists up to that location within the block, as provided by the check circuit 125 for the odd and even half-rate Viterbi bit estimates at that location.

By the time that the end of the current modulation code block is reached, the parity values become known, and the best contained event and best straddling event block 102 holds the best error-event of each of the seven parity values (in the case of the three bit code) for the present modulation block. Therefore, if an error-event was a single event contained entirely within the block, then it would be known to be a particular error-event because it corresponds to the best error-event for the parity (error syndrome) that was actually determined.

If the error-event turns out to straddle adjacent modulation code blocks, there must have been a parity error detected for each of the two consecutive blocks. In such case the block 102 looks for the best straddling error-event that corresponds to the appropriate parity errors for both of the blocks. The best event block 104 looks for two error-events per block by considering error-events which pair up in a certain way. Two error-events with a certain parity could pair up and give a different parity.

The best event circuit 104 compares the error-metrics of the double error-events. If a sum of the error-metrics of the two error-events has the right parity, and has a metric which is more likely than a metric associated with the best single event, then the double error event is selected at the block 104.

And after all of these determinations have been progressively made within blocks 102 and 104, the best result is provided to the postcode correction block 108 via a path 128, and the postcode correction block 108 makes the necessary correction(s) before the current block leaves the post-processor 60. A data flow diagram set forth as FIG. 8 provides a further illustration of the structural arrangement and process flow of the post-processor 60

Figure 9:
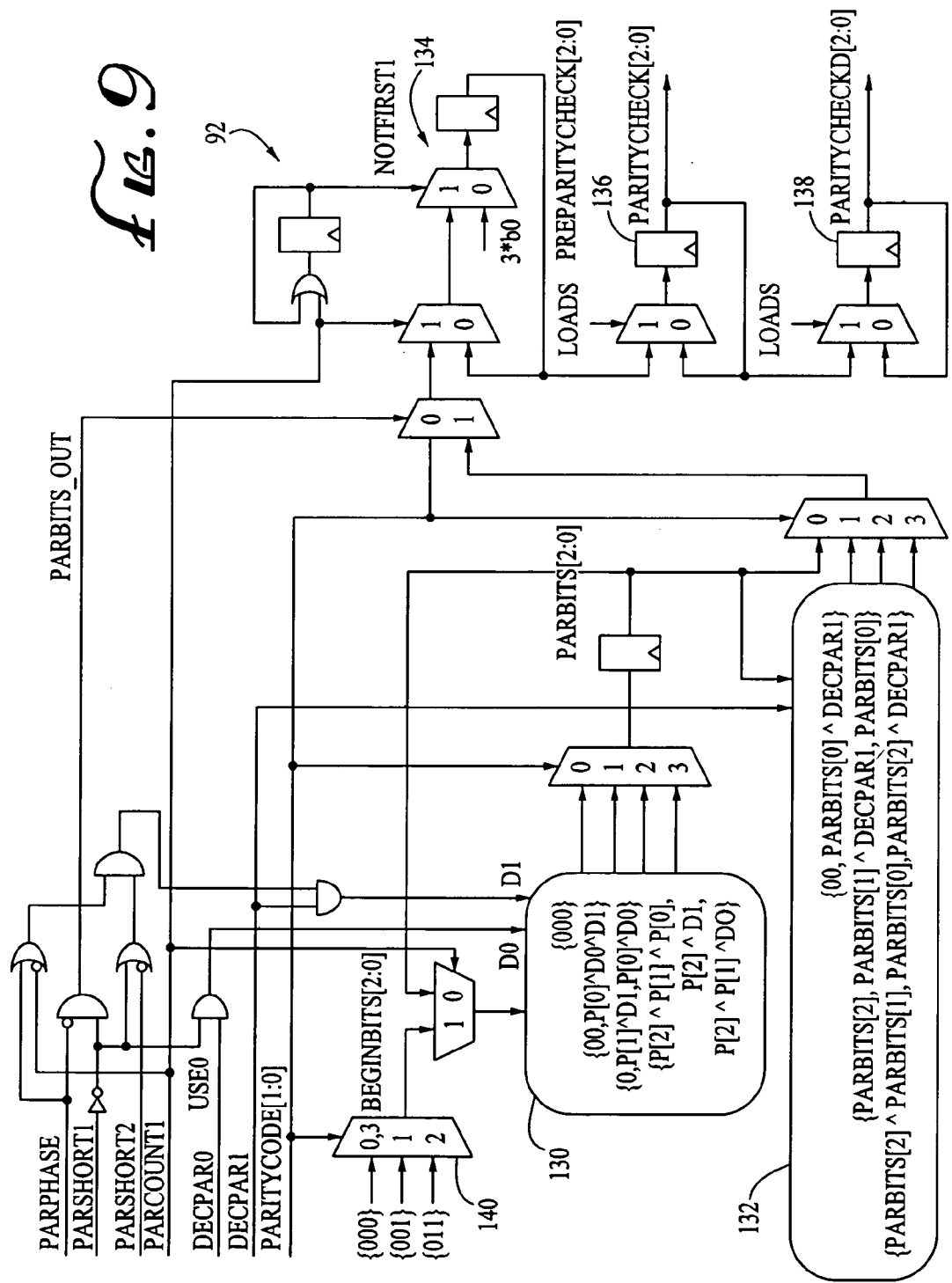
FIG. 9 is a block diagram of a parity code decoder within the FIG. 6 post-processor.

The parity decoder 92 is shown in FIG. 9. At the beginning of each block the parity decoder 92 is reset. The output of the Viterbi detector 50 is first sent through a polarity-controlled device 91 (FIG. 6) that inverts the bits if a control SERVOPOL is true, and sends these bits, denoted by r1, r2, . . . rn, through the post-processor 60 including the parity decoder 92.

A polynomial R(x) represents a channel code block (including parity bit(s)) received at the parity decoder 92, such that $R(x) = r_N + R_{N−1}x + r_{N−2} \ldots x^2 \ldots + R_1 X^{N−1} = C(x) + E(x)$, where C(x) is the polynomial representing a correct block, and where E(x) is the error polynomial. The parity decoder 92 functions to detect the error sequence E(x). If the error sequence E(x) is detectable, then the parity ρ is non-zero.

The one bit parity code is decoded by taking the complement of the modulo-2 sum of the bits of the channel code block in accordance with ρ=1+R(1)(mod 2). The two bit parity code is decoded by taking the complement of the modulo-2 sum of the even bits, and the complement of the modulo-2 sum of the odd bits, of the channel code block, in accordance with $\rho_1=(1+((R(1)-R(-1))/2)(\mod 2)$, $\rho_2=(1+((R(1)+R(-1))/2)(\mod 2)$, and $\rho=2\rho_1+\rho_2$. The three bit parity code is decoded by finding $\gamma(x)$ which is the remainder of $R(x)$ divided by $g(x)=1+x^2+x^3$. Since the parity encoded block $C(x)$ is divisible by $g(x)$, $\gamma(x)$ is the remainder of $E(x)$ divided by $g(x)$. The parity codes are decoded by blocks 130 and 132.

The parity decoder 92 functions as a division circuit that calculates the remainder $\gamma(x)$ by feeding $r_1$ through $r_N$ through a linear feedback shift register 134. After all N bits of the channel code block have been clocked in, the state of the shift register 134 provides the parity bits $\gamma(x)=\rho_3+\rho_2 x+\rho_1 x^2$ and $\rho_3=4\rho_1+2\rho_2+\rho_3$. A register 136 holds the parity bits for the present channel code block, while a register 138 holds the parity bits for the immediately previous channel code block. Several control signals are used by the decoder 92 including a parity phase PARPHASE which indicates that the first bit in the block was on a first phase, phase 1; several controls related to shortened channel code blocks and take into account pad bits, PARSHORT1 and PARSHORT2; and a half rate pulse occurring at the beginning of each channel code word, PARCOUNT1, wherein either DECPAR1 or DECPAR0 is the first bit in the code word. A parity code selector 140 selects between one bit, two bit and three bit parity codes.

Figures 7, 10:
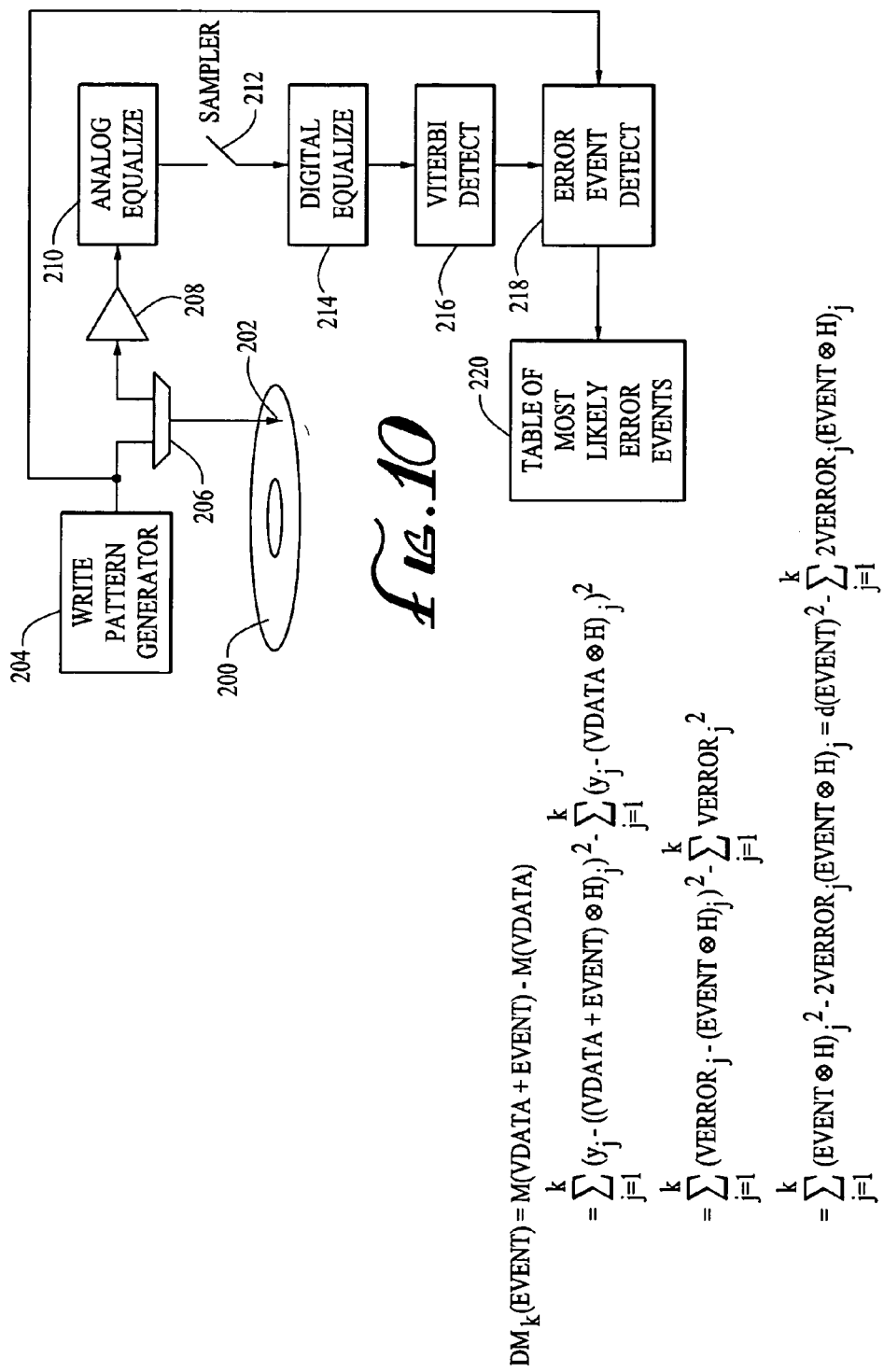
FIG. 7 is a set of equations illustrating calculation of error-event metrics performed by the FIG. 6 post-processor.
FIG. 10 is a schematic and block diagram of a development setup for developing a high rate channel code for use within the FIG. 2 channel architecture in accordance with principles of the present invention.

FIG. 10 depicts schematically a laboratory setup for deriving a list of error-events from a particular partial response channel, such as a magnetic digital recording and playback channel. A magnetic recording disk 200 is rotated at a predetermined angular velocity, in a range between 5000 and 12000 revolutions per minute (RPM). A rotational velocity of 7200 RPM is presently frequently employed for hard disk drives. A magnetic data write/read transducer 202 is carried on a slider forming an air bearing surface relative to an adjacent storage surface of the disk 200 and is radially positionable by a positioning mechanism (not shown) among a multiplicity of e.g. concentric data track loci defined at the storage surface. A write pattern generator 204 generates sequences of data patterns and transfers those patterns to a selected data track of the disk via a write/read mode control process 206 and a write element of the transducer 202.

After a data pattern is written to the disk, the pattern is read by a read element of the transducer 202, and an analog read signal is passed by the mode selector 206 to signal processing stages including, for example, gain amplification and normalization 208, analog channel equalization 210, digital sampling 212 at a predetermined data sampling rate, digital equalization 214, Viterbi detection 216, and error-event detection 218 which compares a detection sequence to an original sequence from the generator 204. A table 220 of most likely error-events is accumulated, and this table becomes the basis for the development of the channel code.

Once a particular magnetic recording channel is characterized as in accordance with FIG. 10 above, or by simulation, a channel of a particular disk drive incorporating the channel design target will usually have adaptivity in the form of channel equalization. It may not be practical to adapt the target of a particular disk drive to a particular head/disk combination without also changing the known error-events and code words. While adaptivity of the channel target to the head/disk combination is possible, such target adaptivity could impose additional complexity within the partial response channel electronics undergoing adaptation.

Thus, it should be understood that the instant disclosure is not to be interpreted as limiting. Various alterations and modifications will no doubt become apparent to those skilled in the art after having considered the present disclosure. Accordingly, it is intended that the appended claims be interpreted as covering all alterations and modifications as fall within the true spirit and scope of the invention.

What is claimed is:

1. A maximum likelihood detector for use within a partial response channel having a channel transfer function and passing user information sequences encoded into code words in accordance with a channel code, the maximum likelihood detector comprising:
   a channel sampler for generating raw samples from the code words;
   a channel equalizer for generating equalized samples from the raw samples using the channel transfer function;
   a first-stage detector for generating unchecked code words from the equalized samples, wherein the first-stage detector is matched to the channel transfer function and the first-stage detector is not matched to the channel code; and
   a second-stage post-processor for generating corrected code words from the raw samples and the unchecked code words, wherein the second-stage post-processor is matched to the channel code and includes:
     a parity checker for generating parity error signals from parity errors in the unchecked code words, wherein the parity errors are due to error-events in the unchecked code words;
     an error metrics generator for generating decision metrics from the raw samples and the unchecked code words using the channel transfer function;
   a decision metrics filter for generating most likely error-events by comparing the error-events with predetermined error-events using the channel code; and
     a code word corrector that generates the corrected code words by removing the most likely error-events from the unchecked code words using the parity error signals and the decision metrics, wherein the most likely error-events include one error-event contained within a single unchecked code word, one error-event straddling two adjacent unchecked code words, multiple error-events contained within a single unchecked code word, and multiple error-events at least one of which straddles two adjacent unchecked code words.

2. The maximum likelihood detector set forth in claim 1 wherein the channel sampler is an analog-to-digital converter, the channel equalizer is a digital finite impulse response filter, and the first-stage detector is a Viterbi detector.

3. The maximum likelihood detector set forth in claim 1 wherein the user information sequences are encoded using a channel modulation code.

4. The maximum likelihood detector set forth in claim 1 wherein the user information sequences include user information blocks and appended error correction syndromes.

5. The maximum likelihood detector set forth in claim 1 embodied within a magnetic recording and playback device.

6. The maximum likelihood detector set forth in claim 5 wherein the magnetic recording and playback device is a disk drive.

7. The maximum likelihood detector set forth in claim 5 wherein the magnetic recording and playback device is a tape drive.

8. The maximum likelihood detector set forth in claim 1 wherein the channel transfer function is a new partial response target having a discrete-time transfer function of $14+8D-8D^2-10D^3-4D^4$ where D is a unit time delay operator.

9. The maximum likelihood detector set forth in claim 1 wherein the channel code includes one of a single bit parity code, a two bit interleaved parity code, and a three-bit modulo-7 parity code having a weighting vector {1 2 4} repeated.

* * * * *